United States Patent [19]

Kuindersma et al.

[11] Patent Number: 4,951,292

[45] Date of Patent: Aug. 21, 1990

[54] COATING FOR DFB/DBR LASER DIODES

[75] Inventors: Pieter I. Kuindersma; Wilma Van Es-Spiekman; Petrus P. G. Mols; Ingrid A. F. M. Baele, all of Eindhoven, Netherlands

[73] Assignee: U.S. Philips Corp., New York, N.Y.

[21] Appl. No.: 371,876

[22] Filed: Jun. 26, 1989

[30] Foreign Application Priority Data

Jul. 1, 1988 [NL] Netherlands ............ 8801667

[51] Int. Cl.$^5$ ................................................. H01S 3/19
[52] U.S. Cl. ....................................... 372/49; 350/164; 372/96
[58] Field of Search ................. 372/49, 46; 350/164

[56] References Cited

U.S. PATENT DOCUMENTS 4,387,960 6/1983 Tani ..................................... 350/164
4,833,684 5/1989 Krekels et al. ........................ 372/49

FOREIGN PATENT DOCUMENTS 0098693 6/1985 Japan ..................................... 372/49
0130187 7/1985 Japan ..................................... 372/49

Primary Examiner—William L. Sikes
Assistant Examiner—Georgia Y. Epps
Attorney, Agent, or Firm—Steven R. Biern

[57] ABSTRACT

In DFB/DBR semiconductor diode lasers, competition may arise between the DFB (Distributed Feed-Back) mode corresponding to the period of the grid present and the FP (=Fabry-Pérot) mode determined by the relative distance of the mirror surfaces, as a result of which the laser does not operate in one single mode. By providing an antireflex layer, this problem is suppressed, but other disadvantages are obtained, such as a large line width. However, by providing a phase layer on the antireflection coating, the operation of the laser in a single mode is combined with a comparatively narrow line width. Furthermore, a reflective coating can be applied to the phase layer. In this case, both the module and the phase of the effective reflection can be adjusted substantially independently of each other, as a result of which a narrow line width and SLM can be more readily combined.

The antireflex coating, the phase layer and the reflective coating can be manufactured by means of not more than two materials having a suitable refractive index. Two particularly suitable materials are hafnium oxide and silicon dioxide, which can be applied to the mirror surfaces by means of the comparatively simple and attractive vapor deposition technique.

9 Claims, 4 Drawing Sheets

COATING FOR DFB/DBR LASER DIODES

BACKGROUND OF THE INVENTION

The invention relates to a semiconductor diode laser surrounded by a medium and comprising a semiconductor body having a pn junction which at a sufficiently high current strength in the forward direction can produce coherent electromagnetic radiation in a strip-shaped active region located within a resonant cavity, the resonant cavity being constituted at least over part of its length by a periodical variation in the effective refractive index in the longitudinal direction, while the resonant cavity is limited by surfaces substantially at right angles to the active region, at least one of these surfaces being provided with an antireflection coating.

Such a semiconductor diode laser is described in Philips European Patent Application No. 87201626.6 which was laid open to public inspection under No. 0259919 on March 16, 1988.

Semiconductor diode lasers of various constructions are used in many fields. The resonant cavity can be formed in different ways. In many cases, it is constituted by two parallel extending mirror surfaces, for which mostly cleavage surfaces of the semiconductor crystal are used. By repeated reflection on these mirror surfaces, radiation modes known under the designation Fabry-Pérot (FP) modes are produced.

According to another embodiment, the resonant cavity is obtained by a periodical variation of the effective refractive index for the radiation produced along at least part of the length of the resonant cavity. Instead of reflection on mirror surfaces, reflection at a grid (constituted by the said periodical variation of the refractive index) is used. Lasers in which this is the case are designated as DFB (Distributed FeedBack) lasers. They exist in various constructions and are known under the designation "Distributed FeedBack"(DFB) lasers, of which construction the semiconductor diode laser described in the aforementioned European Patent Application is an example, and as "Distributed Bragg Reflection" (DBR) lasers. In this application, for the sake of simplicity they will all be indicated by the designation "DFB" laser.

DFB lasers have, as compared with the aforementioned Fabry-Pérot lasers, inter alia the advantage that they can oscillate more readily in a single stable longitudinal oscillation mode (Single Longitudinal Mode or SLM mode) within a large temperature range and with a high output power. This is especially important with the use in optical telecommunication because in the SLM mode the chromatic dispersion is minimal so that the signal can be transported over a large distance without disturbance through the optical glass fiber. Further, DFB lasers can be integrated comparatively readily within an electrooptical monolithic circuit.

However, since in general a DFB laser has at the ends of the active region end faces at right angles to the active layer, Fabry-Pérot oscillations can occur between them so that in principle the DFB laser has at least one FP mode besides at least one DFB mode with substantially equal amplification.

It is very difficult to manufacture lasers by means of the usual technologies in which the position of the mirror surfaces is exactly in phase with the period of the grid. Moreover, the usual processes result in a spread of the properties of lasers manufactured within a wafer. An example of such a property in which spread occurs is the position of the mirror surfaces with respect to the grid. As a result, there will be among the lasers manufactured from one wafer a number of multimode lasers or lasers passing from one mode to another mode, while the yield of SLM lasers will be low. The yield moreover also depends upon the so-called KL product, in which L is the length of the resonant cavity and K is equal to $\pi^* \Delta n / \lambda_b$, where $\Delta n$ is the amplitude of the refractive index variation and $\lambda_b$ is the Bragg wavelength. With a KL product of 2 to 3, the yield of SLM lasers is, for example, 5 to 10% of the yield of FP lasers. With smaller values of this product, the yield approaches zero.

In order to suppress the FP mode not desired in DFB lasers, various measures have been suggested, among which, as described in the aforementioned European Patent Application, the use of an antireflection coating. Substantially the whole quantity of radiation produced by the laser now emanates at the mirror surface (or the mirror surfaces) and the FP mode is suppressed. A disadvantage of this method is that the line width of the SLM strongly increases. The sensitivity to reflection variations also strongly increases. Due to a larger line width and an increased sensitivity to reflection, use, especially at high modulation frequencies, is limited, which, like the fact that the lasers do not operate in the SLM mode, limits the use within the field of optical telecommunication.

SUMMARY OF THE INVENTION

The invention has inter alia for its object to obviate this disadvantage and to combine a high yield with a narrow line width, at least a line width as narrow as possible.

The invention is based inter alia on the recognition of the fact that this object can be achieved in that the feedback of radiation into the resonant cavity is increased. The feedback can be increased in that a part of the radiation emanating through the mirror surfaces is thrown back via a reflection. The invention is further based on the recognition of the fact that such a reflection must and also can take place in such a manner that the radiation fed back has a phase which is correct for the SLM mode of operation, that is to say that the phase corresponds to the effective refractive index variation in the resonant cavity. This is connected with the recognition of the fact that it is possible and advantageous to adjust the phase ($\phi$) and the amplitude ($|r_{eff}|$) of the effective reflection [$r_{eff} (= |r_{eff}|*e^{i\phi})$], which is to be understood to include the addition of all the reflection at the various interfaces, independently or at least as independently as possible of each other.

According to the invention, a DFB semiconductor diode laser of the kind mentioned above is for this purpose characterized in that a layer which is designated as a phase layer, is applied to the antireflection coating, as a result of which at least a part of the radiation transmitted by the antireflection coating is fed back into the resonant cavity, the refractive index and the thickness of said layer being chosen so that for effective reflection there is provided a phase optimal for single mode operation.

When the material from which the phase layer is manufactured has been chosen, the phase of the effective reflection can be caused to correspond to the period of the grid by varying the thickness of the phase layer, as a result of which SLM operation is obtained. Before the antireflection coating or the phase layer is applied, the lasers already operating in the SLM mode can be selected from the lasers manufactured from one wafer. The remaining lasers are now provided with the antireflection coating and the phase layer. The antireflection ensures that substantially no radiation is fed back into the active layer before the radiation has the desired phase. The phase layer ensure that the desired phase of the effective reflection is obtained. The desired phase can be derived from measurements or calculations. The phase layer may also be given the desired thickness in a stepwise manner, i.e. in a cycle of coating and measuring. As soon as a laser operates in the SLM mode, this laser is then put aside.

In a first embodiment, the antireflection coating comprises, like the phase layer, a single layer. The thickness of the antireflection layer must then correspond approximately to the optical path length of a quarter wavelength for the radiation produced by the laser. With respect to the reflections at the various interfaces between the various layers, it holds that:

$$|r_1| - |r_2| = 0. \tag{1}$$

Herein $|r_i|$ is the module of the reflection at the interface between the $i^{th}$ and the $i-1^{th}$ layer. The $0^{th}$ layer is the semiconductor body. Elaboration of equation (1) gives the following condition, which must be fulfilled by the refractive indices:

$$n_1 = (n_0 * n_2)^{\frac{1}{2}}. \tag{2}$$

Herein $n_0$ is the refractive index of the semiconductor body, which for $A_{III}$-$B_v$ materials and the usual wavelengths of radiation is about 3.2; $n_1$ is the refractive index of the antireflex layer and $n_2$ is the refractive index of the phase layer. If the phase layer is made of hafnium oxide (HfO$_2$), of which material the technological advantages are described in the aforementioned European Patent Application, the value of $n_2$ is equal to 1.76. It follows then from equation (1) that $n_1$ must be approximately equal to 2.4. Titanium dioxide (TiO$_2$), whose refractive index is 2.2, fulfils this requirement fairly accurately.

The choice of materials for manufacturing the antireflection coating can be enlarged in that the latter is composed of several layers, for example two layers. Besides hafnium oxide, silicon dioxide (SiO$_2$) is an attractive material from a viewpoint of manufacturing technique. The refractive index of the latter material is about 1.45. By means of these materials, a two-layer antireflex coating can be composed.

- In a second embodiment of the semiconductor diode laser according to the invention, the antireflection coating comprises two layers successively having a higher and a lower refractive index, which refractive indices both lie between the refractive index of the semiconductor body and that of the medium, the thickness of said antireflection coating corresponding approximately to an optical path length of a quarter wavelength for the radiation produced by the laser, while the phase layer comprises a layer having a refractive index lying between that of the semiconductor body and that of the medium and higher than that of the second layer of the antireflection coating. The chosen order of succession of the refractive indices of the various layers is of importance besides the thicknesses thereof for the operation both of the antireflection coating and of the phase layer according to the invention. The refractive indices of the three layers are chosen so that the reflection at the first three interfaces is a minimum, that is to say:

$$|r_1| - |r_2| - |r_3| = 0. \tag{3}$$

Herein $|r_i|$ again is the module of the reflection at the interface between the $i^{th}$ layer and the $i-1^{th}$ layer The $0^{th}$ layer is again the semiconductor body.

In order to limit as far as possible the number of materials used, a third embodiment is characterized in that the first layer of the antireflection coating and the phase layer consist of a first material, while the second layer of the antireflex coating consists of a second material. The refractive index of the phase layer therefore now has the subscript 1. Elaboration of the equation (3) for this case gives the following relation for the refractive indices:

$$(n_0 * n_2 - n_1) - \tfrac{1}{2} * n_1 * (n_0 - n_2) = 0. \tag{4}$$

It appears that inter alia the combination of hafnium oxide (HfO$_2$, $n_1 = 1.76$) and silicon dioxide (SiO$_2$, $n_2 = 1.45$) satisfies this relation accurately. Also certain other material combinations satisfy accurately equation (4), but, as already set out hereinbefore, the said combination offers practical advantages. The phase ($\phi$) of the effective reflection can be calculated by the following equation:

$$\varphi = (4\pi/\lambda) * (n_1 * d_3) \tag{5}$$

Herein $\lambda$ is the wavelength of the radiation, $d_3$ is the thickness and $n_1$ is the refractive index of the phase layer.

Therefore, a fourth embodiment of a semiconductor diode laser according to the invention is characterized in that the first material is hafnium oxide (HfO$_2$) and the second material is silicon dioxide (SiO$_2$).

The phase of the effective reflection can thus be chosen substantially independently of the module of the effective reflection, it is true, but the module of the effective reflection is determined by the transition from the phase layer to the medium. In view of the fact that the medium generally will be air and that a given material is chosen for the phase layer, the value of the module of the effective reflection is fixed. In order to obtain a maximum yield and optimum properties, that is to say a largest possible number of SLM devices having a comparatively narrow line width, it is favorable if the effective reflection upon emanation of the radiation from the laser can be chosen freely, that is to say independently of the phase chosen. In fact, if, for example, after a cycle of measuring, coating and re-measuring, it has been ascertained that the phase of the effective reflection by means of the phase layer has reached the desired value and if, in order to obtain a smaller line width, the effective reflection should be further increased, a phase variation occurring during this increase of the effective reflection is undesirable.

A fifth embodiment of a semiconductor diode laser according to the invention is for this purpose characterized in that a reflective coating is applied to the phase layer, by means of which the module of the effective reflection is adjusted independently of the phase. More particularly, this can be achieved if a laser according to the invention is characterized in that the reflective coating comprises lasers having a refractive index lying between that of the semiconductor body and that of the medium, whose number is even and whose thickness approximately corresponds to an optical path length of a quarter wavelength for the radiation produced by the semiconductor diode laser, which layers have alternately a lower and a higher refractive index, while the first layer has a lower refractive index than the phase layer.

Similar considerations again apply also to the reflective coating as given above with respect to the choice of the materials of which the antireflection coating can be composed. In order to limit the number of materials, for all layers having a lower refractive index a first material can be chosen and for all layers having a higher refractive index a second material can be chosen. For practical reasons, the combination of hafnium oxide ($HfO_2$) and silicon dioxide ($SiO_2$) is to be preferred. The desired value of the effective reflection of the emanating radiation will mostly lie between 10 and 60%.

It should be noted that the thickness of the "$\frac{1}{4}\lambda$" layers, i.e. layers whose thickness corresponds to an optical path length of the radiation of a quarter wavelength, also includes thicknesses which slightly deviate therefrom, that is to say that the thicknesses may lie, for example, between $0.15\lambda$ and $0.35\lambda$. It should be noted that with the considerations essential to the invention and with the formulae used the occurrence of multiple reflections in the layers is neglected. In practice, this provides an amply sufficient accuracy, also with respect to the aforementioned tolerances of the thickness of the "$\frac{1}{4}\lambda$" layers.

Further embodiments are therefore characterized in that the reflective coating comprises two or four layers.

BRIEF DESCRIPTION OF THE DRAWING

The invention will now be described with reference to several embodiments and the drawing, in which.

Figure 1:
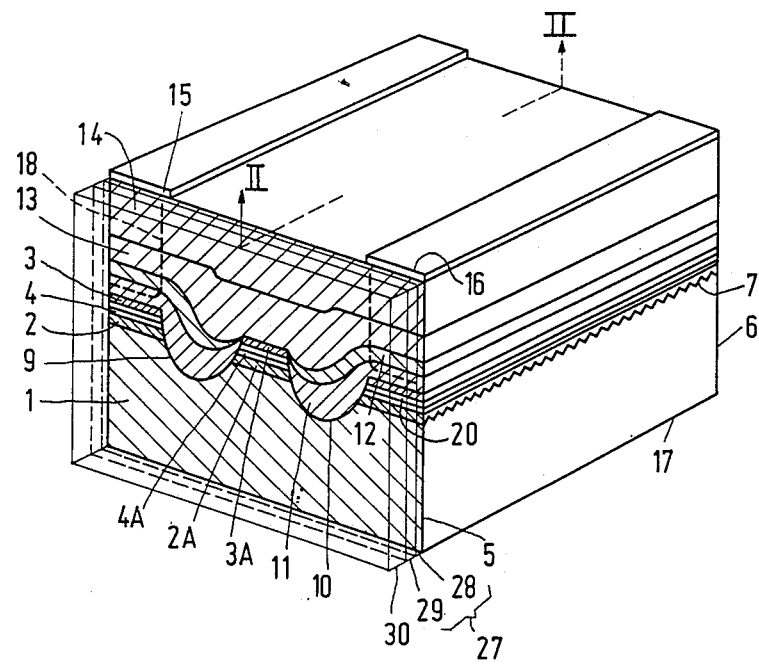
FIG. 1 shows partly in perspective view and partly in cross-section diagrammatically a first embodiment of a semiconductor diode laser according to the invention.

The Figures are schematic and not drawn to scale, while especially the dimensions in the direction of thickness are exaggerated for the sake of clarity. Corresponding parts are generally designated by the same reference numerals in the various embodiments. Semiconductor regions of the same conductivity type are generally cross-hatched in the cross-sections in the same direction.

DESCRIPTION OF THE PREFERRED EMBODIMENTS

Figure 2:
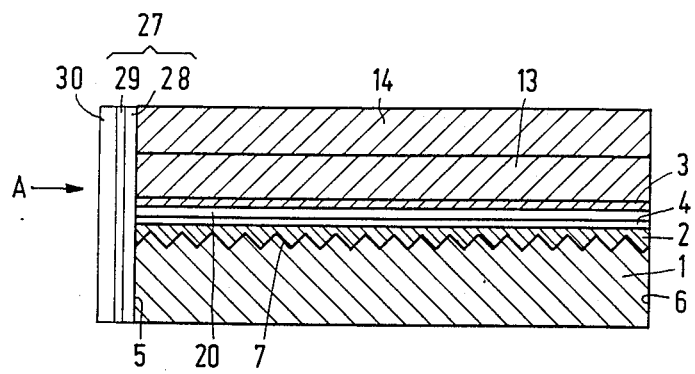
FIG. 2 shows diagrammatically in cross-section taken on the line II—II the semiconductor diode laser of FIG. 1.
Figure 3:
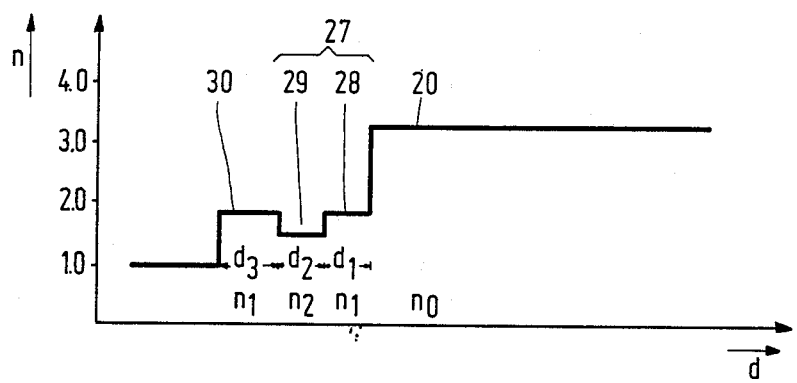
FIG. 3 shows diagrammatically the refractive index profile of the semiconductor diode laser in the cross-section of FIG. 2 at the area of point A.

FIG. 1 shows partly in cross-section and partly in perspective view a first embodiment of a semiconductor diode laser according to the invention. A diagrammatic cross-section of the semiconductor diode laser of FIG. 1 taken on the line II—II is shown in FIG. 2. FIG. 3 shows diagrammatically the refractive index profile of FIG. 2 at the area of point A. The semiconductor diode laser (cf. FIG. 1) comprises a semiconductor body having a substrate 1 of a first conductivity type and a layer structure disposed on it. This layer structure comprises at least a first passive layer 2 of the said first conductivity type, a second passive layer 3 of the second opposite conductivity type and an active layer 4 lying between the first and the second passive layer. A pn junction (whose position depends upon the conductivity type of the semiconductor region located between the layers 2 and 3) is situated between the layers 2 and 3 in the layer structure. This pn junction can produce, at a sufficient current strength in the forward direction, coherent electromagnetic radiation in a strip-shaped region 4A of the active layer located within a resonant cavity. The first and second passive layers 2 and 3 both have for the laser radiation produced a lower refractive index than the active layer 4 and have a larger band gap than the layer 4. In this embodiment, a third passive layer 20 is present between the layer 4 and the layer 3. This layer is a so-called anti-melt-back layer, which serves to avoid back-dissolving—a problem occurring in liquid phase epitaxy. Since this problem does not always occur, the presence of this layer is not absolutely necessary.

The resonant cavity is constituted by a periodical refractive index variation in the longitudinal direction and over at least part of the length of the active region 4A. This refractive index variation is obtained by a grid 7, which is etched into the substrate surface and whose grooves are filled with material of the layer 2, which has a refractive index for the emitted radiation different from that of the substrate 1. The active region 4A is further bounded by end faces 5 and 6, which are substantially at right angles to the active region and one of which (the face 5) is provided with an antireflection coating 27 and a phase layer 30. The second passive layer 3 and the substrate 1 are electrically connected (through the intermediate semiconductor regions) to metal layers (16, 17), which are provided on the upper and the lower surface and serve as connection conductors.

In this embodiment, the substrate 1 consists of indium phosphide (InP) of the n-conductivity type. The layer 2 consists of n-type indium gallium arsenic phosphide ($In_xGa_{1-x}As_yP_{1-y}$). The active layer 4 also consists of indium gallium arsenic phosphide. The layer 3 consists of p-type indium phosphide.

The laser according to this embodiment is of the so-called DCPBH type and comprises a current-limiting layer structure. The laser has two grooves 9 and 10, which limit the active region 4A and in which a layer 11 of p-type InP and a blocking layer 12 of n-type InP are provided. The layers 11 and 12 do not extend on the strip-shaped part 3A of the layer 3 located between the grooves 9 and 10. Further, a layer 13 of p-type Inp is formed over the assembly and a top layer 14 of $In_xGa_{1-x}As_yP_{1-y}$ is formed thereon, on which a silicon oxide layer 15 is disposed. This oxide layer 15 is provided with a slot-shaped opening, within which an electrode layer 16 provided on the surface contacts the layer 14. The lower surface is contacted with the electrode layer 17.

The antireflection coating 27 comprises a first layer 28 and a second layer 29. The layer 28 and the phase layer 30 both consist of hafnium oxide ($HfO_2$), while the layer 29 consists of silicon dioxide ($SiO_2$). The refractive index of hafnium oxide for the radiation produced by this laser ($\lambda = 1.55$ μm) is $n_1 = 1.76$, while the corresponding value for silicon dioxide is $n_2 = 1.45$. The thickness of the layers 28 and 29 approximately corresponds to an optical path length of a quarter wavelength for the radiation produced by the laser and is about 220 nm for the layer 28 and about 267 nm for the layer 29, respectively. The thickness of the phase layer 30 depends upon the desired phase of the effective reflection, which in turn depends upon the phase which is necessary to cause the laser to operate in the SLM mode. This can be determined by measurements and/or calculations. For the semiconductor diode laser used in this embodiment, this phase was 90°. The thickness of the phase layer 30 can now be calculated by means of equation (5) and is in this embodiment about 110 nm. The module of the effective reflection ($|r_{eff}|$) in this embodiment depends only upon the material of which the phase layer 30 consists and upon the medium. Since the former is hafnium oxide and the latter is air, the reflection coefficient $R_f$ in this embodiment is about 9% ($R_f = |r_{eff}|^2$).

The operation of the coating described in this embodiment was ascertained as follows. From the DFB semiconductor diode lasers manufactured from eight slices with a KL product of 1 to 2.5, first the SM lasers were selected. Then all the remaining operating lasers were covered with a one-layer antireflection coating consisting of hafnium oxide and having a thickness approximately corresponding to an optical path length of a quarter wavelength of the radiation produced by the laser. This coating resulted in a $R_f$ of 0.5% and a $|\phi|$ of 180° for the effective reflection. Subsequently, the SM lasers were selected again. However, these lasers had a line width of 120 MHz on an average at an output power of 4 mW, while the line width of the uncoated SM lasers was 20 MHz on an average in the same measuring conditions. After this cycle of measuring, providing the coating and measuring, the coating on the lasers not operating in the SM mode was extended to the coating described in this embodiment. The line width of the DFB lasers thus obtained was on an average 35 MHz in the same measuring conditions. This means that the coating described in this embodiment results in a substantial improvement of the yield and the line width of the SM lasers with respect to SM lasers provided with a one-layer antireflection coating (a factor of 3.4 improvement), while the resulting line width is only a factor of 1.7 larger than that of uncoated SM lasers.

Figure 4:
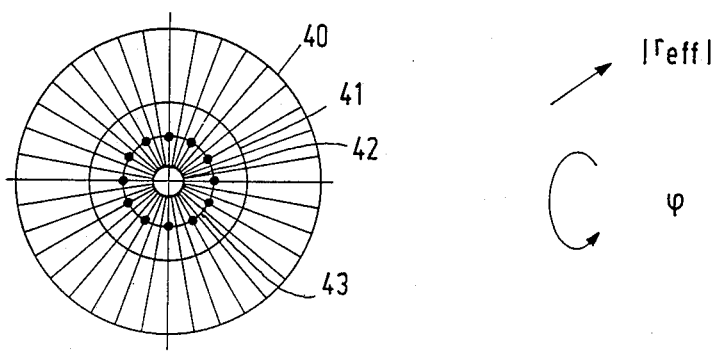
FIG. 4 shows diagrammatically in a polar diagram the module ($|r_{eff}|$) and the phase ($\phi$) of the effective reflection in the semiconductor diode laser of FIG. 1 for different values of the thickness of the phase layer ($d_3$)

FIG. 4 shows diagrammatically in a polar diagram the module ($|r_{eff}|$) and the phase ($\phi$) of the effective reflection in the semiconductor diode laser of FIG. 1 for different values of the thickness of the phase layer ($d_3$). The circles 40, 41 and 42 correspond to a $|r_{eff}|$ value of 1.0, 0.5 and 0.1, respectively. The corresponding values for the reflection coefficient $R_f(=|r_{eff}|^2)$ are then 1.0, 0.25 and 0.01, or 100%, 25% and 1%, respectively. In the Figure, there are points 43 approximately on a circle whose radius corresponds to a $R_f$ value of 9%. These points indicate the phase of the effective reflection as determined by the equation (5), as variable only the thickness of the phase layer 30 ($d_3$) being considered. The Figure shows that for the same $R_f$ value the effective reflection can be given any desired phase between 0° and 360°.

For the compositions of the semiconductor layers and for the manufacture of the semiconductor diode laser described here, reference is made to the aforementioned European Patent Application. The layer 28 of hafnium oxide, the layer 29 of silicon dioxide and the layer 30 of hafnium oxide are successively applied by vapor deposition to one of the end faces of the laser, in this case the end face 5. The thicknesses of the layers 28, 29 and 30 are 220, 267 and 110 nm, respectively. The application by vapor deposition can be effected in a usual manner.

Figure 5:
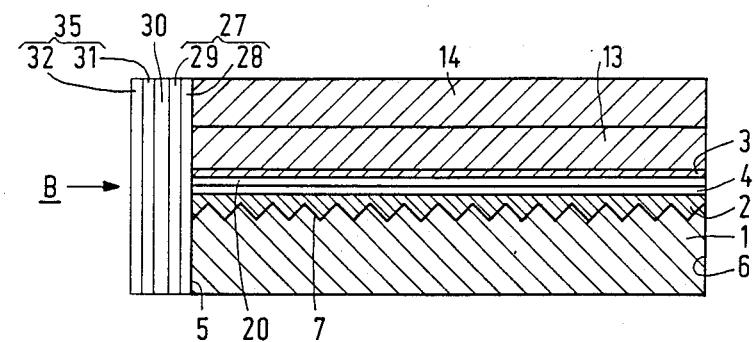
FIG. 5 shows diagrammatically in cross-section taken on the line II—II in FIG. 1 a second embodiment of a semiconductor diode laser according to the invention, which differs from the first embodiment only by the coating.
Figure 6:
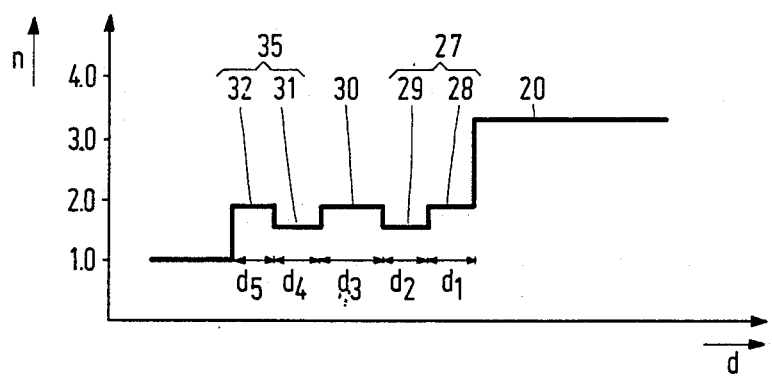
FIG. 6 shows diagrammatically the refractive index profile of the semiconductor diode laser of FIG. 5 at the area of point B.
Figure 7:
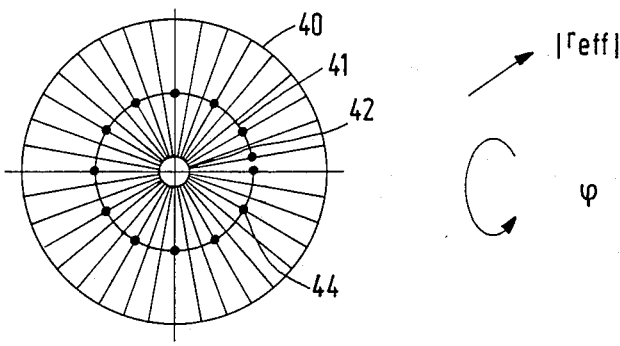
FIG. 7 shows diagrammatically in a polar diagram the module ($|r_{eff}|$) and the phase ($\phi$) of the effective reflection in the semiconductor diode laser of FIG. 5 for different values of the thickness of the phase layer ($d_3$)

FIG. 5 shows diagrammatically in cross-section taken on the line II—II in FIG. 1 a second embodiment of a semiconductor diode laser according to the invention, which differs from the first embodiment only by the coating. FIG. 6 shows diagrammatically the refractive index profile of the semiconductor diode laser of FIG. 5 at the area of point B. Construction and manufacture of the semiconductor diode laser described in this embodiment are—except the construction of the coating—equal to those of an earlier embodiment, to which reference is made here. A reflective coating 35 is applied to the phase layer 30 and comprises a first layer 31 and a second layer 32. For the materials of which these layers are made, use is made of the same materials of which the antireflex coating 27 is composed, but in the reverse order of succession. The layer 31 consists of silicon dioxide, while the layer 32 consists of hafnium oxide. The thicknesses of these layers again approximately correspond to an optical path length of a quarter wavelength of the radiation produced by the laser and are therefore approximately equal to the thicknesses of the corresponding layers in the antireflection coating: $d_4 = 267$ nm and $d_3 = 220$ nm. The thickness of the phase layer follows from the desired phase of the effective reflection and can be calculated by means of the equation (5). FIG. 7 shows diagrammatically in a polar diagram the module ($|r_{eff}|$) and the phase ($\phi$) of the effective reflection in the semiconductor diode laser of FIG. 5 for different values of the thickness of the phase layer ($d_3$). The circles 40, 41 and 42 have already been described with reference to FIG. 4. In FIG. 7, the points 44 corresponding to different phases all lie on a circle having a value $R_f$ of 25%. By the use of a reflective coating between the phase layer and the medium, as in this embodiment, the value of the effective reflection can be varied substantially independently of the phase, while by means of the phase layer the phase can be varied independently of the effective reflection. The advantage thereof has already been set out above.

Figure 8:
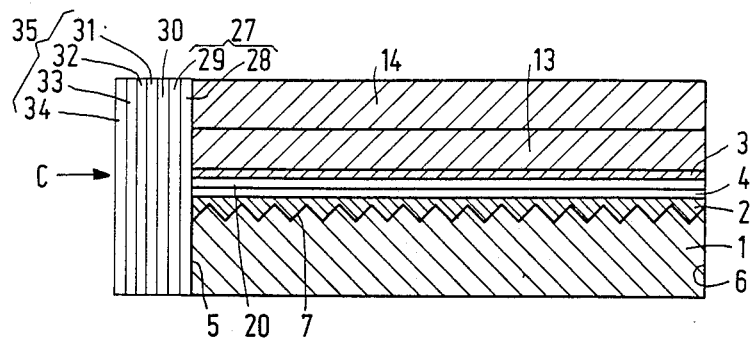
FIG. 8 shows diagrammatically in cross-section taken on the line II—II in FIG. 1 a third embodiment of a semiconductor diode laser according to the invention, which differs from the first embodiment only by the coating.
Figure 9:
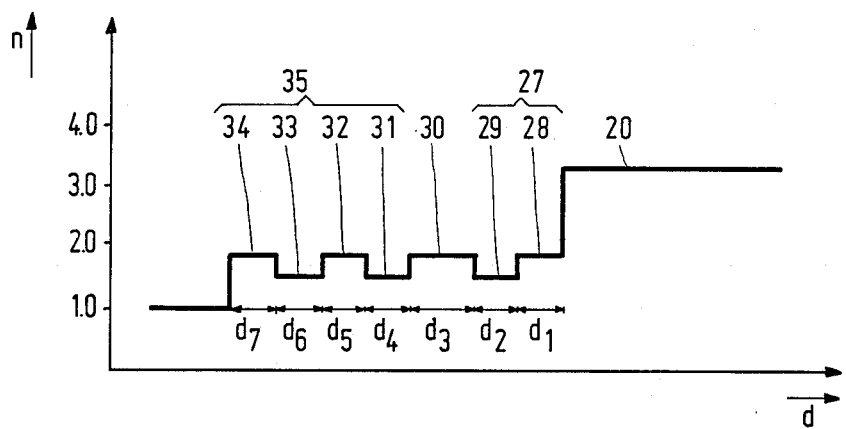
FIG. 9 shows diagrammatically the refractive index profile of the semiconductor diode laser of FIG. 8 at the area of point C.
Figure 10:
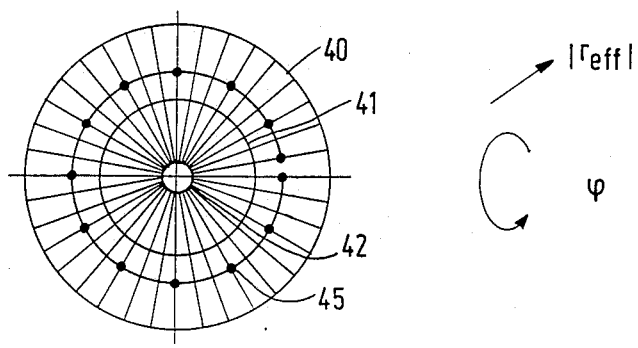
FIG. 10 shows diagrammatically in a polar diagram the module ($|r_{eff}|$) and the phase ($\phi$) of the effective reflection in the semiconductor diode laser of FIG. 8 for different values of the thickness of the phase layer ($d_3$).

FIG. 8 shows diagrammatically in cross-section taken on the line II—II in FIG. 1 a third embodiment of a semiconductor diode laser according to the invention, which differs from the preceding embodiments by the coating. FIG. 9 shows diagrammatically the refractive index profile of the semiconductor diode laser of FIG. 8 at the area of point C. FIG. 10 shows diagrammatically in a polar diagram the module ($|r_{eff}|$) and the phase ($\phi$) of the effective reflection in the semiconductor diode laser of FIG. 8 for different values of the thickness of the phase layer ($d_3$). The considerations made with respect to the construction and the manufacture of the second embodiment also apply to this embodiment. The reflective coating 35 is extended with respect to the preceding embodiment with a further silicon dioxide layer 33 and a further hafnium oxide layer 34. The thickness of the layers 29, 31 and 33 is about 267 nm and the thickness of the layers 28, 32 and 34 is about 220 nm. These thicknesses again approximately correspond to an optical path length of a quarter wavelength of the radiation produced by the laser in the said materials. As appears from FIG. 10, any desired phase can now be adjusted with a value $R_f$ of 40%.

Although in this Application the invention is described with reference to the DCPBH laser structure very important for optical telecommunication, the use of a $\phi$-coating according to the invention is also of great importance for other laser structures of the DFB or DBR type for the same reasons as in the structure described (here), in order to obtain a suppression as efficient as possible of Fabry-Pérot modes and radiation in one single mode of oscillation. The invention is therefore not limited at all to the given embodiments, but relates to all forms of lasers in which the resonant cavity is constituted by a periodical variation of the effective refractive index over at least part of the length of the active region or over at least part of that part of the resonant cavity which lies outside the active region.

We claim:

1. A semiconductor diode laser surrounded by a medium and comprising a semiconductor body having a pn junction, a layered semiconductor structure, a resonant cavity, a strip-shaped active region located within said resonant cavity for producing coherent electromagnetic radiation during operation, the resonant cavity comprising over at least part of its length means for effecting a periodical variation in the effective refractive index in the longitudinal direction, the resonant cavity being bounded by surfaces which are substantially at right angles to the active region, at least one of said surfaces being provided with an antireflection coating, characterized in that a phase layer is applied to the antireflection coating, whereby at least a part of the radiation transmitted by the antireflection coating is fed back into the resonant cavity, and in that means are provided for selecting the refractive index and the thickness of said layer so that a phase optimal for single mode operation is provided for the effective reflection.

2. A semiconductor diode laser as claimed in claim 1 characterized in that the antireflection coating comprises two layers having viewed, from the semiconductor body, successively a higher and a lower refractive index, which refractive indices both lie between the refractive index of the semiconductor body and that of the medium, and having a thickness corresponding to an optical path length of a quarter wavelength for the radiation produced by the laser, the phase coating comprising a layer having a refractive index lying between that of the semiconductor body and that of the medium and higher than that of the second layer of the antireflex coating.

3. A semiconductor diode laser as claimed in claim 2, characterized in that the first layer of the antireflection coating and the phase layer comprise of a first material, while the second layer of the antireflection coating comprises of a second material.

4. A semiconductor diode laser as claimed in claim 3, characterized in that the first material is hafnium oxide ($HfO_2$) and the second material is silicon dioxide ($SiO_2$).

5. A semiconductor diode laser as claimed in claim 1, 2, 3, or 4, characterized in that a reflective coating is applied to a phase layer, as a result of which the effective reflection of the radiation produced by the laser is selectable independently of the phase.

6. A semiconductor diode laser as claimed in claim 5, characterized in that the reflective coating comprises layers having a refractive index lying between that of the semiconductor body and that of the medium, whose number is even and whose thickness corresponds to an optical path length of a quarter wavelength for the radiation produced by the semiconductor diode laser and which alternately have a lower and a higher refractive index, the first of these layers having a lower refractive index than the phase layer.

7. A semiconductor diode laser as claimed in claim 6, characterized in that the reflective coating comprises two layers.

8. A semiconductor diode laser as claimed in claim 6, characterized in that the reflective coating comprises four layers.

9. A semiconductor diode laser as claimed in claim 6, characterized in that the materials of which the layers of the reflective coating are made are the same as the materials of which the layers of the antireflex coating and the phase layer are made.

* * * * *